US009899094B2

(12) United States Patent
Hong

(10) Patent No.: US 9,899,094 B2
(45) Date of Patent: Feb. 20, 2018

(54) NONVOLATILE MEMORY DEVICE FOR SUPPORTING FAST CHECKING FUNCTION AND OPERATING METHOD OF DATA STORAGE DEVICE INCLUDING THE SAME

(71) Applicant: SK hynix Inc., Gyeonggi-do (KR)

(72) Inventor: Ji Man Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/189,725

(22) Filed: Jun. 22, 2016

(65) Prior Publication Data

US 2017/0221570 A1 Aug. 3, 2017

(30) Foreign Application Priority Data

Jan. 29, 2016 (KR) ........................ 10-2016-0011348

(51) Int. Cl.

| | |
|---|---|
| ***G11C 16/34*** | (2006.01) |
| ***G11C 16/26*** | (2006.01) |
| ***G11C 16/10*** | (2006.01) |
| ***G11C 16/28*** | (2006.01) |

(52) U.S. Cl.

CPC .......... *G11C 16/3418* (2013.01); *G11C 16/10* (2013.01); *G11C 16/26* (2013.01); *G11C 16/28* (2013.01); *G11C 16/3422* (2013.01); *G11C 16/3431* (2013.01)

(58) Field of Classification Search

CPC ..... G11C 16/26; G11C 16/28; G11C 16/3418; G11C 16/3422; G11C 16/3431

See application file for complete search history.

(56) References Cited

U.S. PATENT DOCUMENTS

| | | | | |
|---|---|---|---|---|
| 7,965,555 B2 * | 6/2011 | Namiki | G11C 16/0483 | 365/185.17 |
| 8,116,160 B2 * | 2/2012 | Hwang | G06F 11/1068 | 365/185.22 |
| 8,194,465 B2 * | 6/2012 | Namiki | G11C 11/5628 | 365/185.22 |
| 8,711,634 B2 * | 4/2014 | Futatsuyama | G11C 11/5642 | 365/185.22 |
| 8,937,835 B2 * | 1/2015 | Lei | G11C 16/26 | 365/185.17 |
| 8,942,043 B2 * | 1/2015 | Yuan | G11C 16/10 | 365/185.03 |
| 9,349,479 B1 * | 5/2016 | Sehgal | G11C 16/3427 | |
| 9,547,571 B2 * | 1/2017 | Yang | G11C 16/3404 | |

FOREIGN PATENT DOCUMENTS

KR 1020140100327 8/2014

* cited by examiner

*Primary Examiner* — Vanthu Nguyen

(74) *Attorney, Agent, or Firm* — IP & T Group LLP

(57) ABSTRACT

A nonvolatile memory device includes a memory block including a plurality of memory cells which are coupled to a plurality of word lines; and a control unit configured to perform a read operation in response to a read command for target memory cells which are coupled to a target word line, wherein the control unit performs the read operation by applying a read bias voltage to the target word line, applying a first pass bias to a monitoring word line, applying a second pass bias to one or more adjacent word lines adjacent to the target word line, and applying a third pass bias to remaining word lines.

16 Claims, 8 Drawing Sheets

NONVOLATILE MEMORY DEVICE FOR SUPPORTING FAST CHECKING FUNCTION AND OPERATING METHOD OF DATA STORAGE DEVICE INCLUDING THE SAME

CROSS-REFERENCES TO RELATED APPLICATION

The present application claims priority under 35 U.S.C. § 119(a) to Korean application number 10-2016-0011348, filed on Jan. 29, 2016, in the Korean Intellectual Property Office, which is incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a nonvolatile memory device may include: a memory block including a plurality of memory cells which are coupled to a plurality of word lines; and a control unit suitable for performing a read operation in response to a read command for target memory cells which are coupled to a target word line, wherein the control unit performs the read operation by applying a read bias voltage to the target word line, applying a first pass bias to a monitoring word line, applying a second pass bias to one or more adjacent word lines adjacent to the target word line, and applying a third pass bias to remaining word lines.

In an embodiment, a method for operating a data storage device including a nonvolatile memory device including a memory block including a plurality of memory cells which are coupled to a plurality of word lines may include: receiving a read command for target memory cells which are coupled to a target word line; and performing a read operation to the target memory cells in response to the read command, wherein the read operation is performed by applying a read bias voltage to the target word line, applying a first pass bias to a monitoring word line, applying a second pass bias to one or more adjacent word lines adjacent to the target word line, and applying a third pass bias to remaining word lines.

In an embodiment, a method for operating a data storage device including a nonvolatile memory device including a memory block including a plurality of memory cells may include: performing a read operation to target memory cells included in the memory block, the performing of the read operation including accelerating data damage with respect to monitoring memory cells included in the memory block; performing a fast checking operation to the monitoring memory cells; and performing a data recovery operation to the memory block, according to a result of performing the fast checking operation.

DETAILED DESCRIPTION

Hereinafter, various embodiments of the present invention including a data storage device and an operating method thereof will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars of the drawings, that the drawings are not necessarily to scale, and, in some instances, proportions may have been exaggerated in order to more clearly depict certain features of the invention. While particular terminology is employed, it is to be appreciated that the terminology employed is for describing particular embodiments only and is not intended to limit the scope of the present invention.

Figure 1:
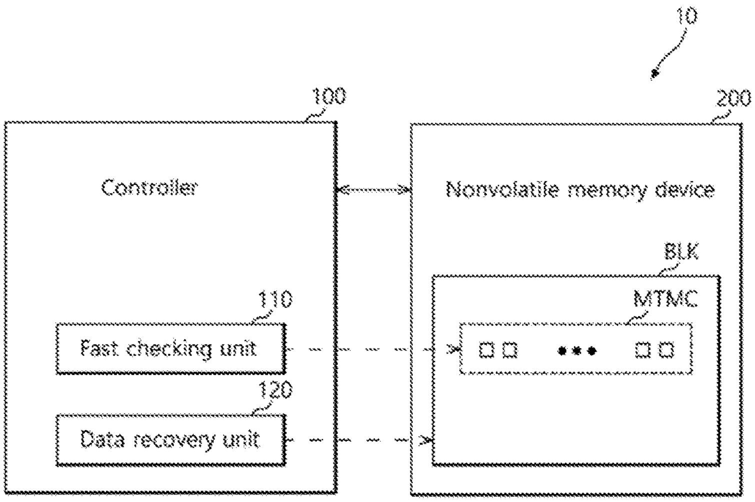
FIG. 1 is a block diagram illustrating a data storage device according to an embodiment of the present invention.

Referring now to FIG. 1 a data storage device 10 is provided, according to an embodiment of the present invention.

The data storage device 10 may be configured to store data provided from an external device, in response to a write request from the external device. Also, the data storage device 10 may be configured to provide stored data to the external device, in response to a read request from the external device.

The data storage device 10 may be configured as a Personal Computer Memory Card International Association (PCMCIA) card, a compact flash (CF) card, a smart media card, a memory stick, a multimedia card (MMC), an embedded MMC (eMMC), a reduced-size multimedia card (RS-MMC) and a micro-size version of MMC (MMC-micro), a secure digital (SD) card, a mini secure digital (mini-SD) and a micro secure digital (micro-SD), a universal flash storage (UFS), a solid state drive (SSD), and the like.

The data storage device 10 may include a controller 100 and a nonvolatile memory device 200.

The controller 100 may control the general operations of the data storage device 10. For example, the controller 100 may store data in the nonvolatile memory device 200 in response to a write request received from the external device, and may read out data stored in the nonvolatile memory device 200 and output read out data to the external device in response to a read request received from the external device.

The controller 100 may include a fast checking unit 110 and a data recovery unit 120.

The fast checking unit 110 may perform a fast checking operation to monitoring memory cells MTMC included in a memory block BLK. For estimating the degree of damage of data stored in the memory block BLK, the fast checking unit 110 may preferentially check data stored in the monitoring memory cells MTMC. The fast checking unit 110 may perform the fast checking operation by reading data from the monitoring memory cells MTMC and checking an error rate of the read data. The fast checking unit 110 may determine the memory block BLK as safe when an error rate of the monitoring memory cells MTMC is smaller than a threshold error rate, and may determine the memory block BLK as unsafe when an error rate of the monitoring memory cells MTMC is larger than the threshold error rate.

As will be described later, the monitoring memory cells MTMC may be coupled to at least one monitoring word line. The monitoring memory cells MTMC may be memory cells for which data damage is intentionally accelerated when compared to the other memory cells of the memory block BLK. Therefore, the monitoring memory cells MTMC may be memory cells for which data damage is most serious in the memory block BLK. As a result, when it is determined through the fast checking operation that data stored in the monitoring memory cells MTMC is still safe, it may be estimated that the entire data stored in the memory block BLK is safe. When it is determined through the fast checking operation that data stored in the monitoring memory cells MTMC is unsafe, then a data recovery operation may be performed for the entirety of the memory block BLK.

The fast checking unit 110 may perform the fast checking operation under a predetermined condition. For example, the fast checking unit 110 may perform the fast checking operation periodically at a predetermined time period, or after completion of a predetermined process.

According to an embodiment, the fast checking unit 110 may perform the fast checking operation according to a read count that counts the number of the read operations which are performed to the memory block BLK. The fast checking unit 110 may perform the fast checking operation to the monitoring memory cells MTMC when the read count for the memory block BLK reaches a threshold read count. As will be described later, when the fast checking operation is performed according to the read count, data damage due to a read disturbance may be effectively prevented. The fast checking unit 110 may reset the read count to an original value (e.g. o) after completion of a fast checking operation prior to start counting read operations for determining when to perform the next fast checking operation.

In an embodiment, the controller 100 may employ the monitoring memory cells MTMC not for storing normal data but for storing random monitoring data for the fast checking operation so that data damage is intentionally caused at an accelerated pace in the monitoring memory cells MTMC. The random monitoring data may be read to check an error rate during the fast checking operation.

In another embodiment, the controller 100 may employ the monitoring memory cells MTMC for storing normal data.

The data recovery unit 120 may perform a data recovery operation to the memory block BLK according to a result of the fast checking operation. When it is determined through the fast checking operation that data stored in the monitoring memory cells MTMC is unsafe, the data recovery unit 120 may perform the data recovery operation by performing an error correcting operation to all data stored in the memory block BLK and storing the error-corrected data in a new memory block (not shown).

The nonvolatile memory device 200 may store data transmitted from the controller 100 to the memory and may read out stored data and transmit read-out data to the controller 100, under the control of the controller 100.

The nonvolatile memory device 200 may include flash memory devices, such as, for example, NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

The nonvolatile memory device 200 may include the memory block BLK. The memory block BLK may include the monitoring memory cells MTMC. The monitoring memory cells MTMC may be coupled to at least one monitoring word line. The nonvolatile memory device 200 may intentionally accelerate damage of data stored in the monitoring memory cells MTMC during the read operation to the memory block BLK. The nonvolatile memory device 200 may exert influence of the read disturbance on the monitoring memory cells MTMC during the read operation to the memory block BLK.

While it is illustrated in FIG. 1 that the nonvolatile memory device 200 includes one memory block BLK, it is to be noted that the nonvolatile memory device 200 may include a plurality of memory blocks.

In an embodiment, the fast checking unit 110 may estimate data damage of the entire memory block BLK through the fast checking operation to the monitoring memory cells MTMC for which data damage is accelerated in the memory block BLK. Hence, without checking all the data stored in a memory block BLK, the fast checking unit 110 allows the data recovery unit 120 to perform a data recovery operation to the memory block BLK only by checking the integrity of the data stored in the monitoring memory cells MTMC. Accordingly, operational performance of the data storage device 10 may be generally improved.

Figure 2:
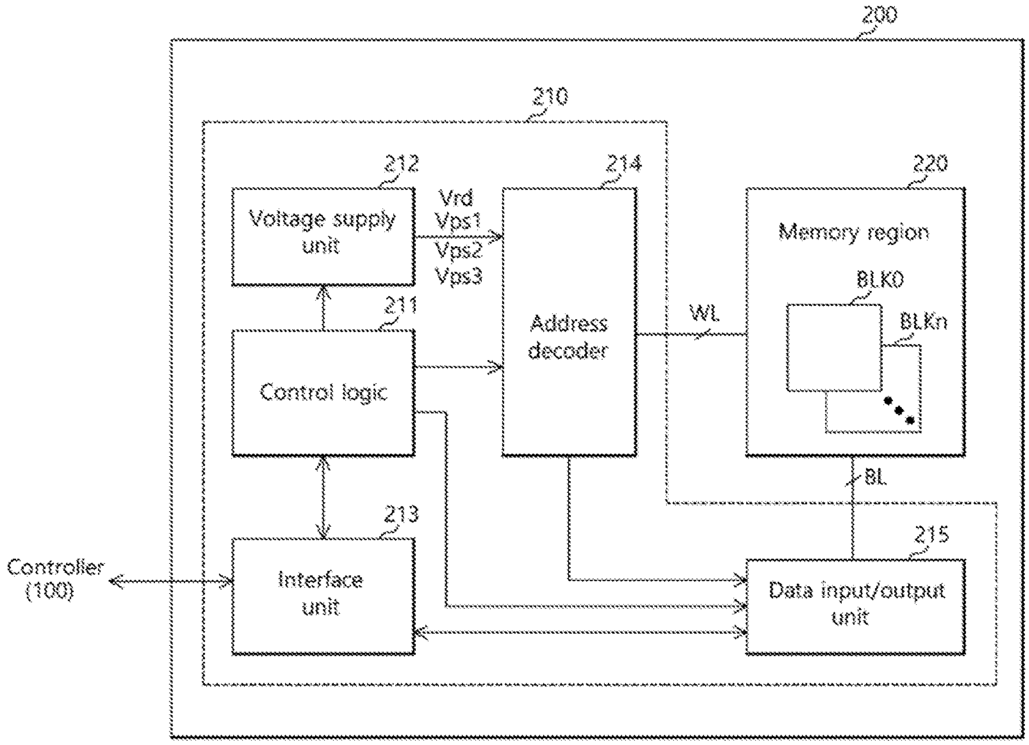
FIG. 2 is a block diagram illustrating an example of a configuration of the nonvolatile memory device of FIG. 1.

FIG. 2 is a block diagram illustrating an example of a detailed configuration of the nonvolatile memory device 200 of FIG. 1.

According to the embodiment of FIG. 2, the nonvolatile memory device 200 may include a control block 210 and a memory region 220.

The control block 210 may include a control logic 211, a voltage supply unit 212, an interface unit 213, an address decoder 214, and a data input/output unit 215.

The control logic 211 may control the general operations of the nonvolatile memory device 200 according to the control of the controller 100. The control logic 211 may receive a command transmitted from the controller 100, through the interface unit 213, and may transmit control signals to internal units of the nonvolatile memory device 200, such as the data input/output unit 215 and the voltage supply unit in response to the command.

The voltage supply unit 212 may generate various operation voltages necessary for the general operations of the nonvolatile memory device 200, according to control of the control logic 211. For example, as illustrated in FIG. 2, the voltage supply unit 212 may supply a read bias voltage Vrd to be employed in a read operation and first to third pass bias voltages Vps1 to Vps3, to the address decoder 214.

The Interface unit 213 may exchange various control signals including commands and addresses and data with the controller 100. The interface unit 213 may transmit various control signals and data inputted thereto, to the internal units of the nonvolatile memory device 200.

The address decoder 214 may decode addresses for selecting areas of the memory region 220 to be accessed in an operation. For example, the address decoder 214 may apply the read bias voltage Vrd and the first to third pass bias voltages Vps1 to Vps3, to word lines WL, according to a decoding result, during a read operation. In more detail, the address decoder 214 may apply the read bias voltage Vrd to a target word line to which target memory cells for which the read operation is to be performed are coupled. At the same time, the address decoder 214 may apply the first pass bias Vps1 to a monitoring word line in a memory block in which the target memory cells are included, apply the second pass bias Vps2 to one or more adjacent word lines adjacent to the target word line, and apply the third pass bias Vps3 to remaining word lines.

The address decoder 214 may control the data input/output unit 215 to selectively drive bit lines BL, according to decoding results.

The data input/output unit 215 may transmit data transmitted from the interface unit 213, to the memory region 220 through the bit lines BL. The data input/output unit 215 may transmit data read out from the memory region 220 through the bit lines BL, to the interface unit 213. The data input/output unit 215 may sense current formed in the bit lines BL as memory cells included in the memory region 220 are turned on and off in response to a read voltage, and may obtain data read from the memory cells, according to the sensing results.

The memory region 220 may be coupled with the address decoder 214 through the word lines WL. The memory region 220 may be coupled with the data input/output unit 215 through the bit lines BL. The memory region 220 may include a plurality of memory cells for storing data, the plurality of memory cells being respectively disposed at areas where the word lines WL and the bit lines BL intersect with each other. The memory region 220 may include memory cell arrays of a two-dimensional or three-dimensional structure.

The memory region 220 may include a plurality of memory blocks BLK0 to BLKn.

Figure 3:
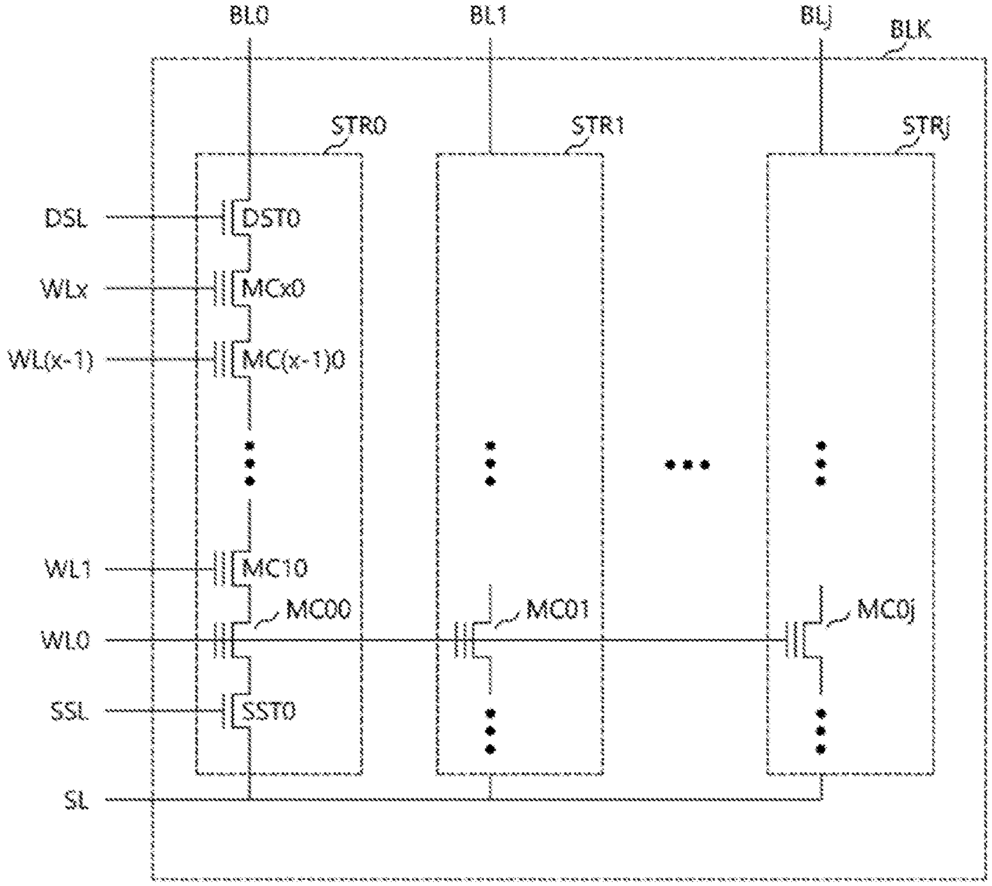
FIG. 3 is a detailed diagram illustrating an example of a configuration of the memory block of FIG. 1.

FIG. 3 is a detailed diagram illustrating an example of a configuration of memory block BLK of FIG. 1. Each of the memory blocks BLK0 to BLKn of FIG. 2 may be configured in substantially the same way as the memory block BLK.

The memory block BLK may include strings STR0 to STRj. Each of the strings STR0 to STRj may be coupled between a source line SL and a corresponding bit line. For example, the string STR0 may be coupled between the source line SL and a bit line BL0.

The strings STR1 to STRj may be configured in substantially the same way as the string STR0, and therefore, the string STR0 will be described herein in more detail as an example. The string STR0 may include a drain select transistor DST0, memory cells MC00 to MCx0, and a source select transistor SST0. The drain select transistor DST0 may have a drain coupled to the bit line BL0 and a gate coupled to a drain select line DSL. The source select transistor SST0 may have a source coupled to the source line SL and a gate coupled to a source select line SSL. The memory cells MC00 to MCx0 may be coupled in series between the drain select transistor DST0 and the source select transistor SST0. Gates of the memory cells MC00 to MCx0 may be coupled to word lines WL0 to WLx, respectively.

Each of the word lines WL0 to WLx may be coupled to corresponding memory cells of the strings STR0 to STRj. For example, the word line WL0 may be coupled to memory cells MC00 to MC0*j* which are included in the strings STR0 to STRj, respectively. A memory cell may be written or read as a corresponding word line is selected and a predetermined bias voltage is applied to the corresponding word line. For example, the memory cells MC00 to MC0*j* may be simultaneously read when the word line WL0 is selected and a predetermined read bias voltage is applied to the word line WL0.

When the monitoring word line is, for example, the word line WL0, the monitoring memory cells MTMC may be the memory cells MC00 to MC0*j*.

Figure 4:
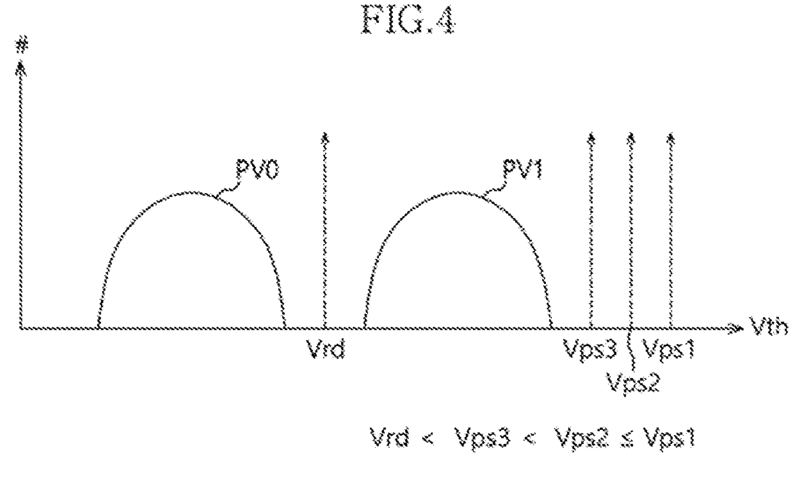
FIG. 4 is a diagram illustrating an example of a read bias voltage and first to third pass bias voltages applied to word lines during a read operation, with respect to threshold voltage distributions.

FIG. 4 is a diagram illustrating an example of the read bias voltage Vrd and the first to third pass bias voltages Vps1 to Vps3 applied to the word lines WL0 to WLx during a read operation with respect to threshold voltage distributions. The horizontal axis Vth represents a threshold voltage of a memory cell, and the vertical axis # represents the number of memory cells corresponding to a threshold voltage.

Referring to FIG. 4, memory cells form threshold voltage distributions PV0 and PV1 according to data stored therein. When, for example, 1-bit data of "1" or "0" is stored in a memory cell, the memory cell may be controlled to have a threshold voltage corresponding to any one of the 2 threshold voltage distributions PV0 and PV1, according to data stored therein.

During the read operation to target memory cells which are coupled to a target word line, the read bias voltage Vrd may be applied to the target word line, and each of the target memory cells may be turned on or off in response to the read bias voltage Vrd according to a threshold voltage thereof. In detail, a target memory cell may be turned on when the applied read bias voltage Vrd is higher than its threshold voltage, and may be turned off when the applied read bias voltage Vrd is lower than its threshold voltage. For example, data "1" may be read when a target memory cell is turned on, and, for example, data "0" may be read when a target memory cell is turned off. Current may be formed in a corresponding bit line BL as a target memory cell is turned on or off, and data may be read by sensing the formed current. The read bias voltage Vrd may be positioned between the threshold voltage distributions PV0 and PV1 so that the threshold voltage distributions PV0 and PV1 of the target memory cells may be identified.

During the read operation, the read bias voltage Vrd may be applied to the target word line, and at the same time, a corresponding one among the first to third pass bias voltages Vps1 to Vps3 higher than the read bias voltage Vrd may be applied to each of the remaining word lines of the memory block excluding the target word line. As described above, since data may be read when current is formed in bit lines BL as the target memory cells are turned on or off, all memory cells excluding the target memory cells should be turned on in the memory block BLK. Accordingly, the first to third pass bias voltages Vps1 to Vps3 should be voltages capable of turning on all the memory cells excluding the target memory cells. That is to say, the first to third pass bias voltages Vps1 to Vps3 may be higher than a maximum threshold voltage which a memory cell of the memory block may have. The first to third pass bias voltages Vps1 to Vps3 will be described in more detail with reference to FIG. 5.

While FIG. 4 shows an example in which 1 bit is stored in each memory cell, however, we note that the embodiment is not limited to such an example. When a plurality of bits are stored in each memory cell and a plurality of threshold voltage distributions are formed, a plurality of read bias voltages may be respectively positioned between the threshold voltage distributions so that the threshold voltage distributions may be identified. Also, first to third pass bias voltages may be higher than a maximum threshold voltage which a memory cell may have.

Figure 5:
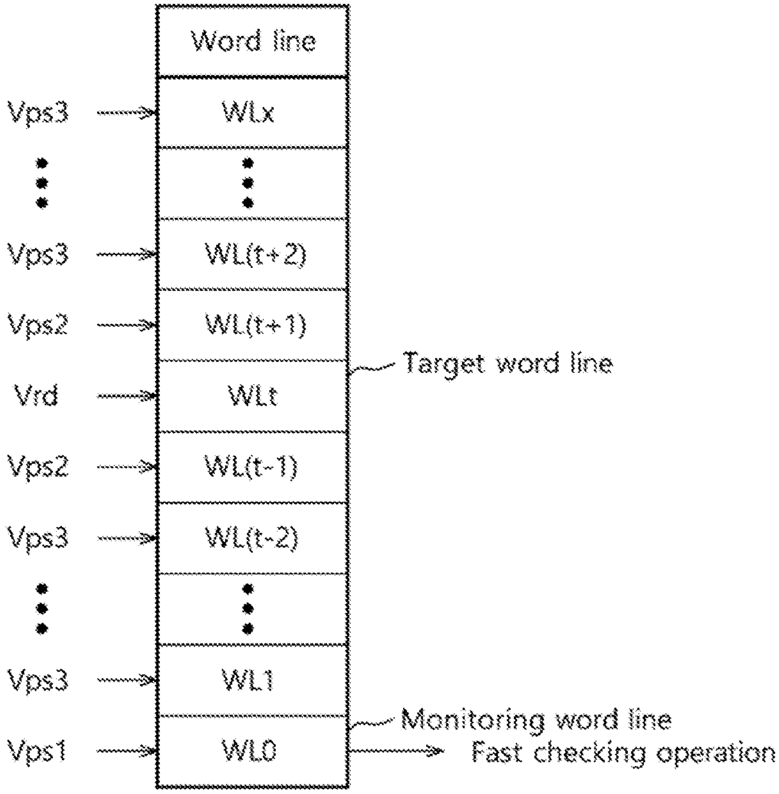
FIG. 5 is a diagram illustrating an example of a read bias voltage and first to third pass bias voltages applied to word lines during a read operation according to an embodiment of the present invention.

FIG. 5 is a diagram illustrating an example of the read bias voltage Vrd and the first to third pass bias voltages Vps1 to Vps3 applied to the word lines WL0 to WLx during a read operation according to an embodiment of the invention. In FIG. 5, for instance, a target word line WLt may be coupled to the target memory cells, and a monitoring word line WL0 may be coupled to the monitoring memory cells MTMC.

According to the embodiment illustrated in FIG. 5, during a read operation, the read bias voltage Vrd may be applied to the target word line WLt. At the same time, the first pass bias Vps1 may be applied to the monitoring word line WL0. At the same time, the second pass bias Vps2 may be applied to word lines WL(t−1) and WL(t+1) which are adjacent to the target word line WLt. At the same time, the third pass bias Vps3 may be applied to all remaining word lines WL1 to WL(t−2) and WL(t+2) to WLx.

The third pass bias Vps3 may turn on memory cells which are coupled to the remaining word lines WL1 to WL(t−2) and WL(t+2) to WLx. The third pass bias Vps3 may be higher than a maximum threshold voltage, which a memory cell of the memory block may have, and may be lower than the first and second pass biases Vps1 and Vps2.

The second pass bias Vps2 may turn on memory cells which are coupled to the adjacent word lines WL(t−1) and WL(t+1). The second pass bias Vps2 may be higher than the third pass bias Vps3. Because electric fields formed by a bias applied to the adjacent word lines WL(t−1) and WL(t+1) diffuse toward the target word line WLt to which the read bias voltage Vrd of a lower level is applied, the second pass bias Vps2 may serve to compensate for such a phenomenon.

Meanwhile, the adjacent memory cells to which the second pass bias Vps2 is applied may be more strongly influenced by a read disturbance than the memory cells to which the third pass bias Vps3 is applied. The threshold voltage of a memory cell may be changed gradually at small adjustments each time the memory cell is influenced by a read disturbance, and an error bit may occur as a result with the lapse of time. Despite that, in a better case, if the read operation is evenly performed in the memory block BLK, all memory cells may be evenly influenced by a read disturbance, and data damage may be delayed. However, in a worse case, if the read operation is iteratively performed to only certain target memory cells in the memory block BLK, the memory cells adjacent to the target memory cells may be influenced in a concentrated manner by a read disturbance, and error bits may easily occur.

In an embodiment, the monitoring memory cells MTMC which are coupled to the monitoring word line WL0 may be intentionally influenced by a read disturbance each time the read operation is performed. The nonvolatile memory device 200 may exert a read disturbance influence on the monitoring memory cells MTMC each time a read operation is performed. As a result, accelerated damage may be reflected to the monitoring memory cells MTMC, and the monitoring memory cells MTMC may be more damaged by the read disturbance in the memory block BLK than the remaining memory cells in the block. To this end, the first pass bias Vps1 applied to the monitoring word line WL0 may be equal to or higher than the second pass bias Vps2. The first pass bias Vps1 may turn on the monitoring memory cells MTMC.

As a result, at a predetermined time, the fast checking operation may be performed to the monitoring memory cells MTMC for which data damage is most severe among the memory cells in the memory block BLK. Hence, when it is determined through the fast checking operation that data stored in the monitoring memory cells MTMC is still safe, it may be estimated that all the data stored in the memory block BLK is safe.

Meanwhile, the monitoring word line WL0 may be an outermost word line which is adjacent to the source line SL of FIG. 3, among the word lines WL0 to WLx corresponding to the memory block BLK. However, we note that the embodiment is not limited in this way. According to an embodiment, the monitoring word line WL0 may be a word line selected to be the earliest (e.g., the first) among the word lines of the memory block BLK, according to a predetermined write sequence, to perform a write operation in the memory block BLK. According to an embodiment, the monitoring word line WL0 may be fixed during a single write-erase cycle from when the memory block BLK is erased to when the memory block BLK is erased again.

In order to be influenced by a read disturbance each time a read operation is performed, the monitoring memory cells MTMC may store random monitoring data for the fast checking operation. The random monitoring data may be read to check an error rate during the fast checking operation.

In another embodiment, the monitoring memory cells MTMC may store normal data, as will be described below with reference to FIG. 6.

Figure 6:
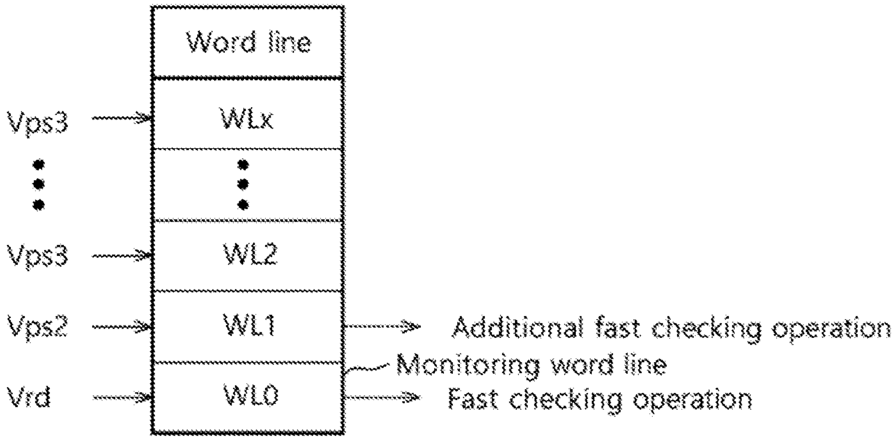
FIG. 6 is a diagram illustrating an example of a read bias voltage and first to third pass bias voltages applied to word lines during a read operation to monitoring memory cells according to an embodiment of the present invention.

FIG. 6 is a diagram illustrating an example of the read bias voltage Vrd and the first to third pass bias voltages Vps1 to Vps3 applied to the word lines WL0 to WLx during the read operation to the monitoring memory cells MTMC according to an embodiment of the present invention. In FIG. 6, for instance, the word line WL0 may be the monitoring word line to which the monitoring memory cells MTMC are coupled.

When the monitoring memory cells MTMC are employed to store normal data, the read operation may be performed to the monitoring memory cells MTMC. In other words, the monitoring word line WL0 may be a target word line. In this case, the read bias voltage Vrd may be applied to the target word line WL0. At the same time, the second pass bias Vps2 may be applied to an adjacent word line WL1 which is adjacent to the target word line WL0. At the same time, the third pass bias Vps3 may be applied to remaining word lines WL2 to WLx.

As a result, during the read operation according to the illustrated embodiment of FIG. 6, the monitoring memory cells MTMC may not be intentionally influenced by a read disturbance, and instead, memory cells adjacent to the monitoring memory cells MTMC, that is, memory cells coupled to the word line WL1, may be strongly influenced by a read disturbance. In a worse case, if the read operation is iteratively performed for only the monitoring memory cells MTMC in the memory block BLK, memory cells for which data damage is most severe in the memory block BLK may be the memory cells coupled to the word lines WL1, instead of the monitoring memory cells MTMC.

Accordingly, in an embodiment, a fast checking operation may be performed preferentially to the monitoring memory cells MTMC at a predetermined time, and then, in preparation for the worse case, an additional fast checking operation may be performed to the memory cells (referred to as sub-monitoring memory cells) coupled to the word line WL1. The additional fast checking operation may be performed to the sub-monitoring memory cells when it is determined through the fast checking operation that data stored in the monitoring memory cells MTMC is safe.

Meanwhile, even though the monitoring memory cells MTMC do not store normal data but the random monitoring data, in the case where the fast checking operation is formed to the monitoring memory cells MTMC by reading random monitoring data, the word lines WL0 to WLx may be applied with the read bias voltage Vrd and the second and third pass bias voltages Vps2 and Vps3 as of FIG. 6.

Meanwhile, even though the monitoring memory cells MTMC store normal data, in the case where the read operation is performed to the memory cells other than the monitoring memory cells MTMC, the word lines WL0 to WLx may be applied with the read bias voltage Vrd and the first to third pass bias voltages Vps1 to Vps3 as of FIG. 5.

Figure 7:
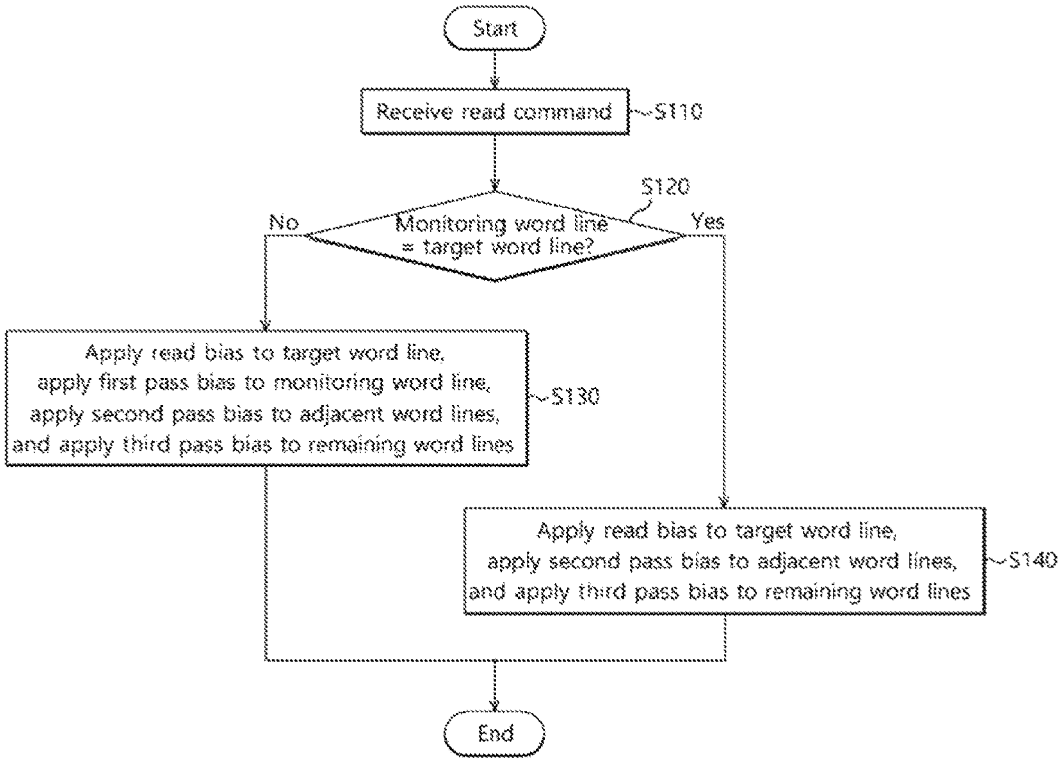
FIG. 7 is a flow chart of an operation method of the nonvolatile memory device of FIG. 1, according to an embodiment of the present invention.

FIG. 7 is a flow chart of an operation method of the nonvolatile memory device 200 of FIG. 1, according to an embodiment of the present invention. Hereinbelow, the method for operating the nonvolatile memory device 200 will be described with reference to FIGS. 1 to 4 and 7.

At step S110, the control unit 210 may receive from the controller 100 the read command for the target memory cells coupled to the target word line.

At step S120, the control unit 210 may determine whether or not the monitoring word line WL0 is the target word line, that is, whether the monitoring memory cells MTMC are the target memory cells. The monitoring memory cells MTMC may be the target memory cells when the random monitoring data or the normal data stored in the monitoring memory cells MTMC are read. When the monitoring word line WL0 does not correspond to the target word line, the process may proceed to step S130. When the monitoring word line WL0 corresponds to the target word line, the process may proceed to step S140.

At step S130, the control unit 210 may perform the read operation by applying the read bias voltage Vrd to the target word line, applying the first pass bias Vps1 to the monitoring word line WL0, applying the second pass bias Vps2 to adjacent word lines adjacent to the target word line, and applying the third pass bias Vps3 to the remaining word lines of the memory block. As a result, as influence of a read disturbance is intentionally exerted on the monitoring memory cells MTMC coupled to the monitoring word line WL0, data damage may be caused to the monitoring memory cells MTMC at an accelerated pace compared to the remaining memory cells of the memory block. The first pass bias Vps1 may be equal to or higher than the second pass bias Vps2, and the second pass bias Vps2 may be higher than the third pass bias Vps3. The first to third pass bias voltages Vps1 to Vps3 may be higher than a maximum threshold voltage which a memory cell may have.

At step S140, the control unit 210 may perform the read operation by applying the read bias voltage Vrd to the monitoring word line WL0 as the target word line, applying the second pass bias Vps2 to adjacent word lines adjacent to the target word line WL0, and applying the third pass bias Vps3 to remaining word lines.

Figure 8:
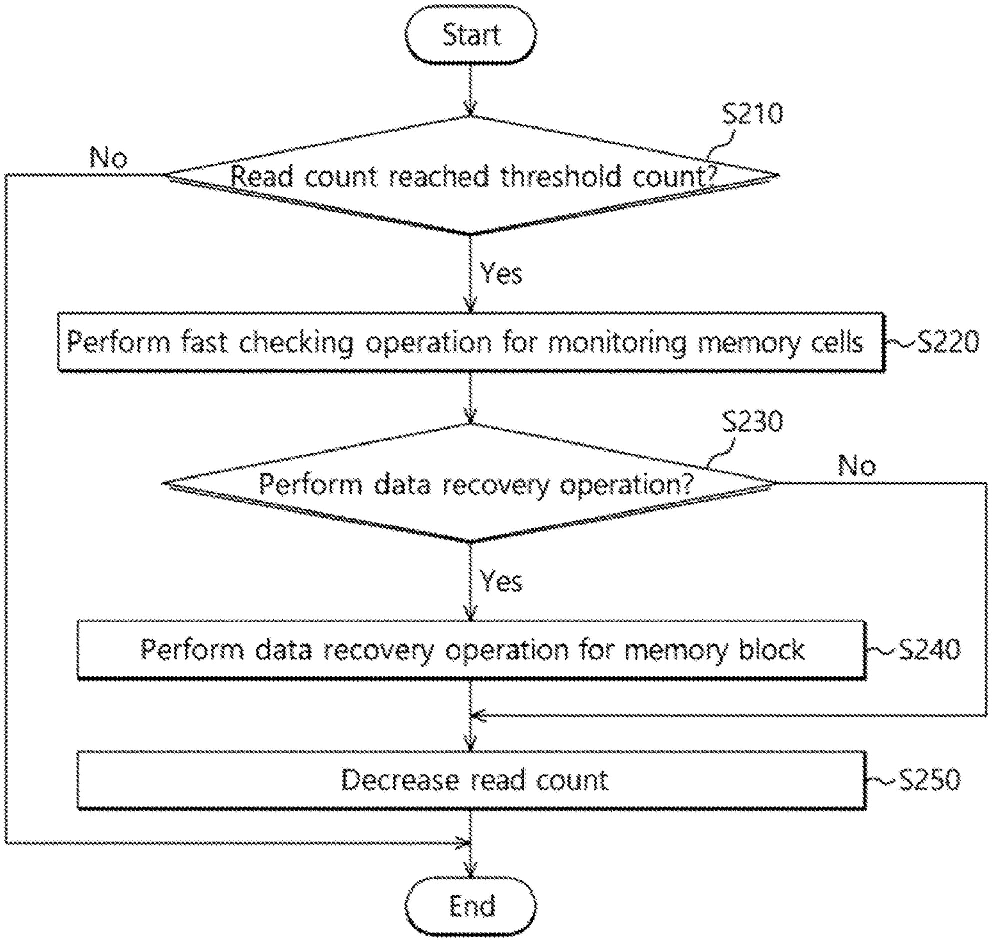
FIG. 8 is a flow chart of a method for operating the data storage device of FIG. 1, according to an embodiment of the present invention.

FIG. 8 is a flow chart of a method for operating the data storage device 10 of FIG. 1, according to another embodiment of the present invention. In the embodiment of FIG. 8, monitoring memory cells MTMC are not employed for storing normal data but for storing random monitoring data for the fast checking operation. Hereinbelow, the method for operating the data storage device 10 will be described with reference to FIGS. 1 and 8.

At step S210, the controller 100 may determine whether the read count corresponding to the memory block BLK has reached the threshold read count. In the case where the read count has reached the threshold read count, the process may proceed to step S220. In the case where the read count has not reached the threshold read count, the process may be ended.

At step S220, the controller 100 may perform the fast checking operation to the monitoring memory cells MTMC included in the memory block BLK. The monitoring memory cells MTMC may be memory cells for which data damage is most serious in the memory block BLK. The controller 100 may perform the fast checking operation by reading data from the monitoring memory cells MTMC and checking the error rate of the read data.

At step S230, the controller 100 may determine whether to perform the data recovery operation to the memory block BLK according to a result of the fast checking operation. The controller 100 may determine to perform the data recovery operation when the error rate of the monitoring memory cells MTMC is larger than the threshold error rate. The controller 100 may determine not to perform the data recovery operation when the error rate of the monitoring memory cells MTMC is smaller than the threshold error rate. When it is determined that the data recovery operation is to be performed, the process may proceed to step S240. When it is determined that the data recovery operation is not to be performed, the process may proceed to step S250.

At step S240, the controller 100 may perform the data recovery operation to the memory block BLK. The controller 100 may perform the data recovery operation by performing the error correcting operation to all data stored in the memory block BLK and storing the error-corrected data in a new memory block.

At step S250, the controller 100 may reset the read count for the memory block BLK.

Figure 9:
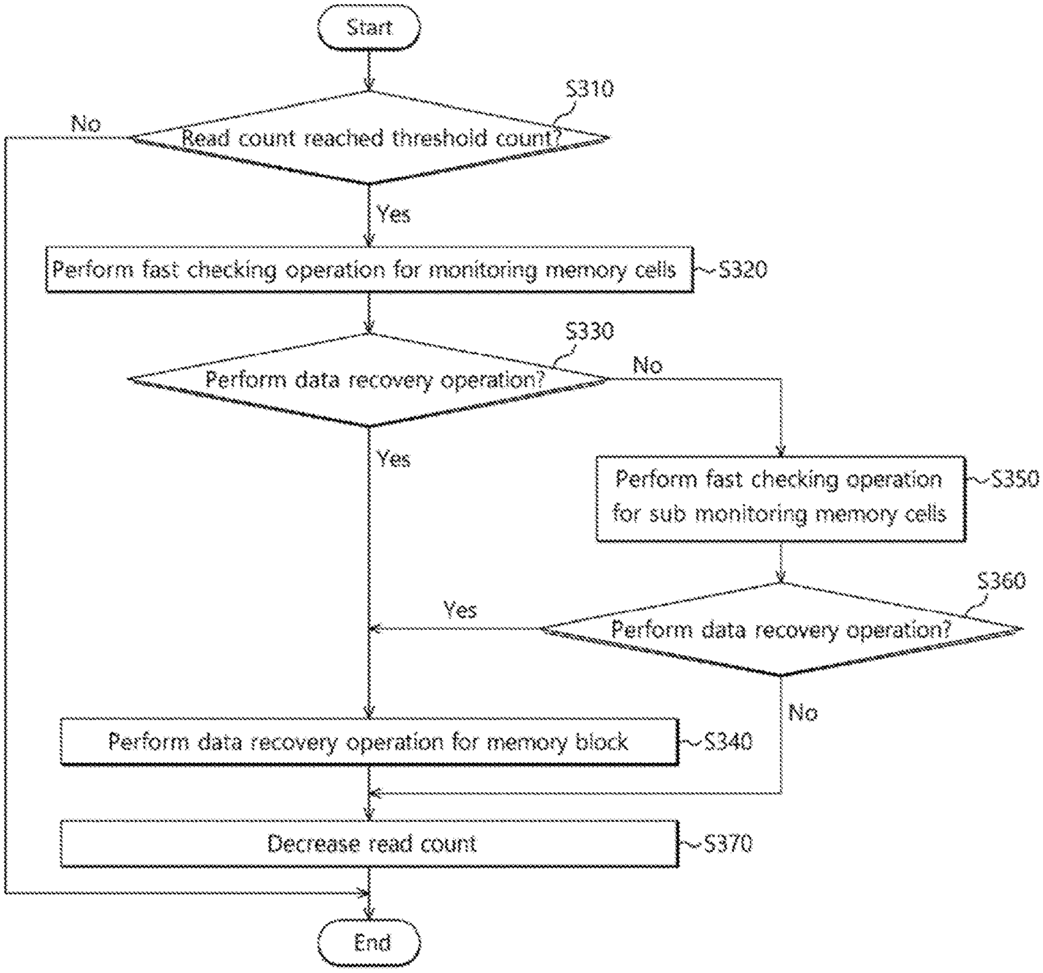
FIG. 9 is a flow chart of a method for operating the data storage device of FIG. 1, according to an embodiment of the present invention.

FIG. 9 is a flow chart of a method for operating the data storage device 10 of FIG. 1 according to yet another embodiment of the present invention. In FIG. 9, monitoring memory cells MTMC may be employed for storing normal data. Hereinbelow, the method for operating the data storage device 10 will be described with reference to FIGS. 1 and 9.

Steps S310 to S340 and S370 may be substantially the same as the steps S210 to S250 of FIG. 8. Therefore, detailed descriptions thereof will be omitted herein.

At step S350, the controller 100 may perform the additional fast checking operation to the sub-monitoring memory cells. The sub-monitoring memory cells may be coupled to a word line which is adjacent to the monitoring word line WL0. Data damage for the sub-monitoring memory cells may be accelerated by subjecting them to the influence of a read disturbance, in the case where the read operation is performed in a concentrated manner for the monitoring memory cells MTMC.

At step S360, the controller 100 may determine whether to perform the data recovery operation to the memory block BLK according to a result of the additional fast checking operation. When it is determined that the data recovery operation is to be performed, the process may proceed to the step S340. When it is determined that the data recovery operation is not to be performed, the process may proceed to the step S370.

Figure 10:
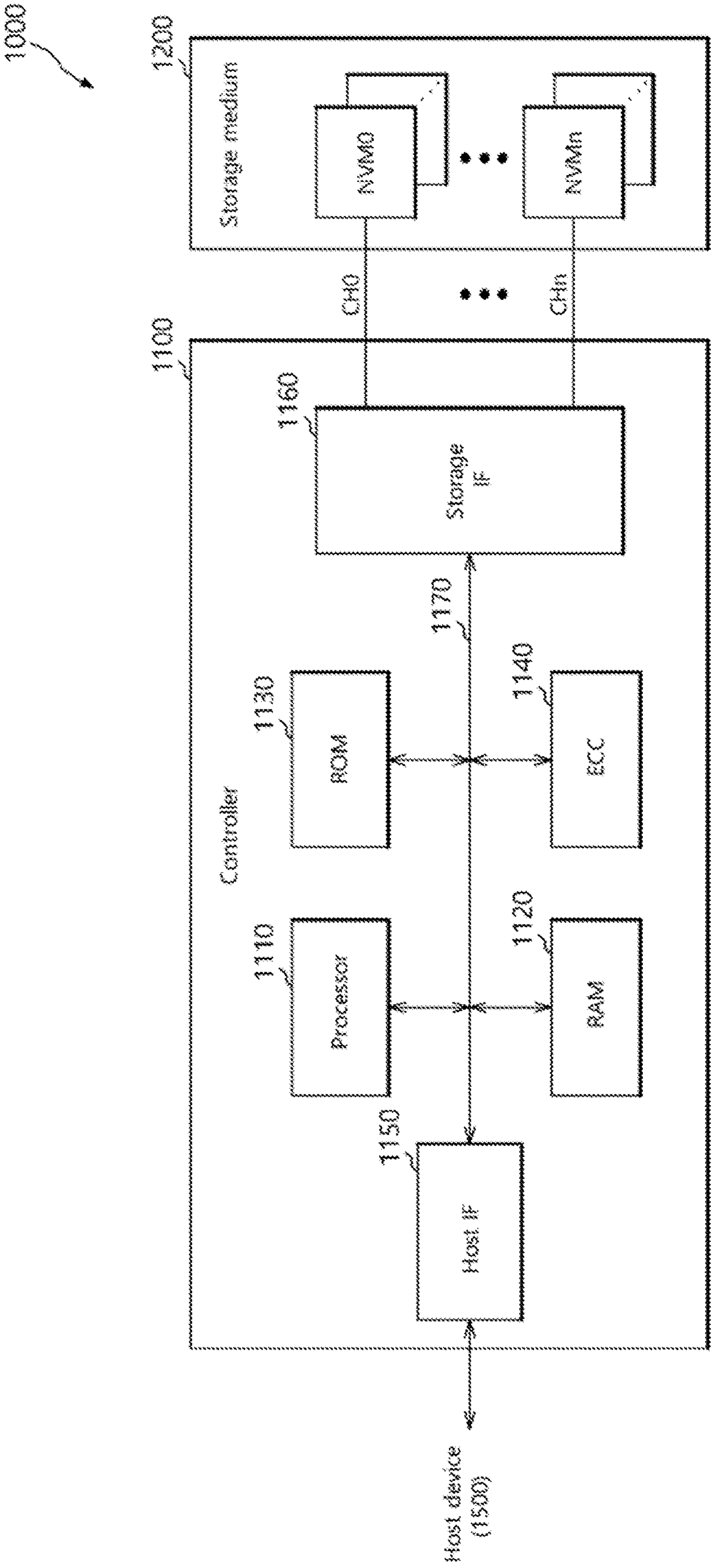
FIG. 10 is a block diagram illustrating a solid state drive (SSD), according to an embodiment of the present invention.

FIG. 10 is a block diagram illustrating a solid state drive (SSD) 1000 according to an embodiment of the present invention.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface 1150, and a storage medium interface 1160.

The controller 1100 may operate in a manner substantially similar to the controller 100 of FIG. 1. The controller 1100 may perform a fast checking operation to monitoring memory cells for which data damage is most serious (e.g. accelerated) in a memory block included in a nonvolatile memory device. The controller 1100 may perform a data recovery operation to the entire memory block according to a result of the fast checking operation.

The processor 1110 may control the general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be employed by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may, for example, exchange data processing requests, data, and the like with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may, for example, include a plurality of nonvolatile memory devices NVM0 to NVMn. Each of the plurality of nonvolatile memory devices NVM0 to NVMn may perform a write operation and a read operation according to the control of the controller 1100.

The storage medium 1200 may, for example, include a plurality of nonvolatile memory devices NVM0 to NVMn. Each of the plurality of nonvolatile memory devices NVM0 to NVMn may perform a write operation and a read operation according to control of the controller 1100. Like the nonvolatile memory device 200 of FIG. 1, each of the plurality of nonvolatile memory devices NVM0 to NVMn may intentionally accelerate damage of data stored in predetermined monitoring memory cells when performing a read operation. Each of the plurality of nonvolatile memory devices NVM0 to NVMn may exert influence of a read disturbance on monitoring memory cells when performing a read operation.

Figure 11:
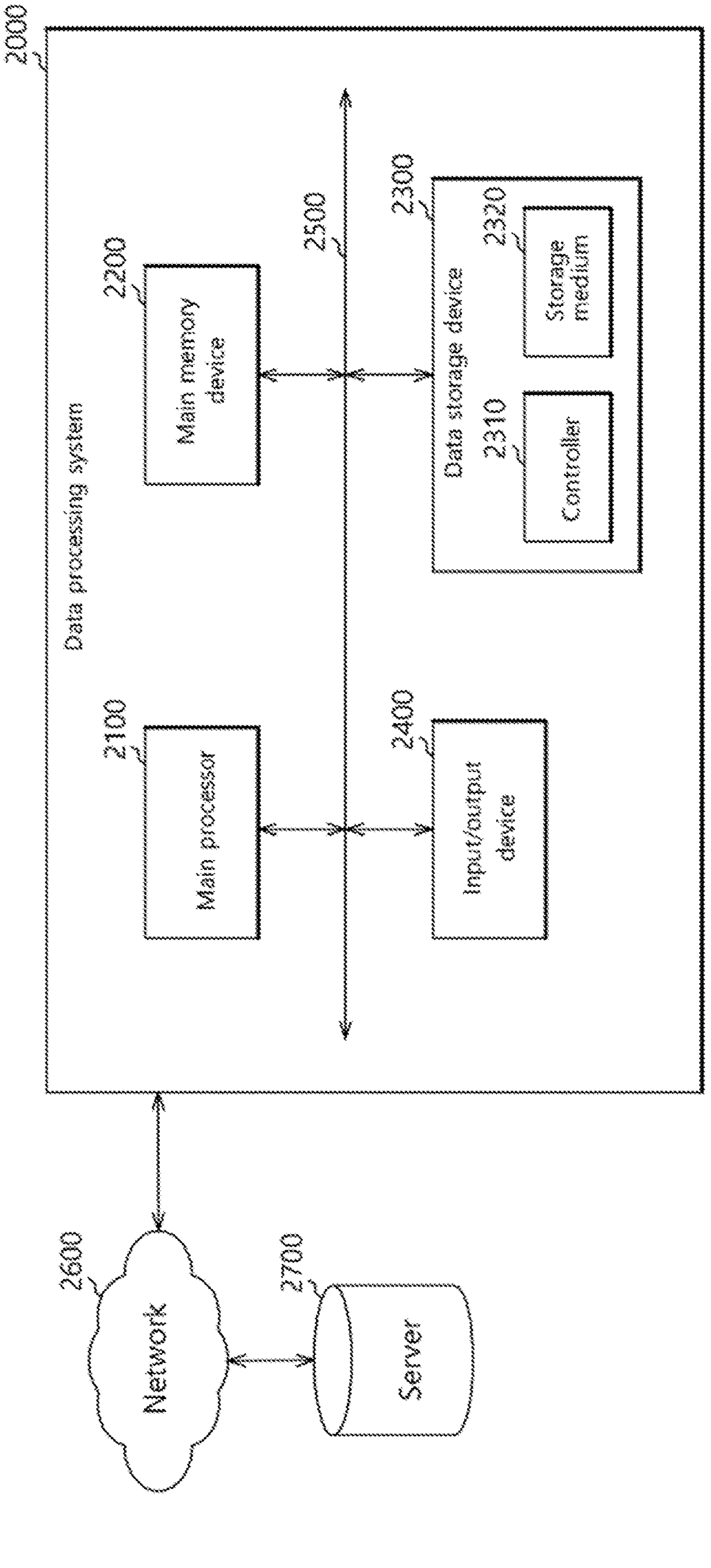
FIG. 11 is a block diagram illustrating a data processing system, including a data storage device, according to an embodiment of the invention.

FIG. 11 is a block diagram illustrating a data processing system 2000 including a data storage device 10, according to an embodiment of the invention.

The data processing system 2000 may include a computer, a laptop, a netbook, a smart phone, a digital TV, a digital camera, a navigator, and the like. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be, for example, a central processing unit such as a microprocessor. The main processor 2100 may execute the softwares of an operation system, an application, a device driver, and so forth, on the main memory device 2200.

The main memory device 2200 may store programs and program data to be employed by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 of FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and/or scope of the present invention as defined in the following claims.

What is claimed is:

1. A nonvolatile memory device comprising:

a memory block including a plurality of memory cells which are coupled to a plurality of word lines; and a control unit suitable for:

performing a read operation to target memory cells which are coupled to a target word line, determining whether to perform a fast checking operation according to a read count of the memory block;

performing the fast checking operation to monitoring memory cells coupled to a monitoring word line; and performing a data recovery operation to the memory block according to a result of performing the fast checking operation, wherein the control unit performs the read operation by applying a read bias voltage to the target word line, applying a first pass bias to the monitoring word line, applying a second pass bias to one or more adjacent word lines adjacent to the target word line, and applying a third pass bias to remaining word lines.

2. The nonvolatile memory device according to claim 1, wherein the first pass bias is equal to or higher than the second pass bias, the second pass bias is higher than the third pass bias, and the third pass bias is higher than the read bias voltage.

3. The nonvolatile memory device according to claim 1, wherein the monitoring word line is an outermost word line among the plurality of word lines.

4. The nonvolatile memory device according to claim 1, wherein the monitoring word line is a first word line in operation order of a write operation among the plurality of word lines.

5. The nonvolatile memory device according to claim 1, wherein, when the monitoring word line is the target word line, the control unit applies the read bias voltage instead of the first pass bias.

6. A method for operating a data storage device including a nonvolatile memory device including a memory block including a plurality of memory cells which are coupled to a plurality of word lines, the method comprising:

receiving a read command for target memory cells which are coupled to a target word line;

performing a read operation to the target memory cells in response to the read command;

determining whether to perform a fast checking operation according to a read count of the memory block;

performing the fast checking operation to monitoring memory cells coupled to a monitoring word line; and performing a data recovery operation to the memory block according to a result of performing the fast checking operation, wherein the read operation is performed by applying a read bias voltage to the target word line, applying a first pass bias to the monitoring word line, applying a second pass bias to one or more adjacent word lines adjacent to the target word line, and applying a third pass bias to remaining word lines.

7. The method according to claim 6, wherein the first pass bias is equal to or higher than the second pass bias, the second pass bias is higher than the third pass bias, and the third pass bias is higher than the read bias voltage.

8. The method according to claim 6, wherein, when the monitoring word line is the target word line, the monitoring word line is applied with the read bias voltage instead of the first pass bias.

9. The method according to claim 6, further comprising storing random monitoring data that is read during the fast checking operation, in the monitoring memory cells.

10. The method according to claim 6, further comprising performing an additional fast checking operation to sub-monitoring memory cells coupled to one or more sub-monitoring word lines adjacent to the monitoring word line according to a result of performing the fast checking operation.

11. The method according to claim 10, further comprising storing normal data in the monitoring memory cells.

12. A method for operating a data storage device including a nonvolatile memory device including a memory block including a plurality of memory cells, the method comprising:

performing a read operation to target memory cells included in the memory block, the performing of the read operation including accelerating data damage with respect to monitoring memory cells included in the memory block;

determining whether to perform a fast checking operation according to a read count of the memory block;

performing the fast checking operation to the monitoring memory cells; and performing a data recovery operation to the memory block according to a result of performing the fast checking operation.

13. The method according to claim 12, further comprising storing random monitoring data that is read during the fast checking operation, in the monitoring memory cells.

14. The method according to claim 12, further comprising performing an additional fast checking operation to sub-monitoring memory cells adjacent to the monitoring memory cells according to a result of performing the fast checking operation.

15. The method according to claim 14, further comprising storing normal data in the monitoring memory cells.

16. The method according to claim 12, wherein the accelerating of the data damage comprises applying a bias higher than a bias applied to remaining word lines to a monitoring word line to which the monitoring memory cells are coupled.

* * * * *